(12) United States Patent
Cohen

(10) Patent No.: US 9,035,809 B2
(45) Date of Patent: May 19, 2015

(54) OPTIMIZING COMPRESSION ENGINE THROUGHPUT VIA RUN PRE-PROCESSING

(71) Applicant: Seagate Technology LLC, Cupertino, CA (US)

(72) Inventor: Earl T. Cohen, Oakland, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/651,655

(22) Filed: Oct. 15, 2012

(65) Prior Publication Data

US 2014/0104085 A1    Apr. 17, 2014

(51) Int. Cl.
    H03M 7/30    (2006.01)
(52) U.S. Cl.
    CPC ................................ *H03M 7/3086* (2013.01)
(58) Field of Classification Search
    USPC .............................. 341/50, 51, 65, 67, 59, 87
    See application file for complete search history.

(56) References Cited

U.S. PATENT DOCUMENTS

| | | | | |
|---|---|---|---|---|
| 4,971,407 A | * | 11/1990 | Hoffman | 341/87 |
| 4,988,998 A | * | 1/1991 | O'Brien | 341/55 |
| 5,627,534 A | * | 5/1997 | Craft | 341/87 |
| 5,701,125 A | | 12/1997 | Berlin | 341/63 |
| 5,951,623 A | | 9/1999 | Reynar et al. | 708/203 |
| 6,411,227 B1 | * | 6/2002 | Fish | 341/65 |
| 7,233,266 B2 | * | 6/2007 | Sasakura | 341/51 |
| 7,342,902 B2 | | 3/2008 | Garakani et al. | 370/329 |
| 7,358,867 B2 | * | 4/2008 | Fallon | 341/51 |
| 7,463,775 B1 | * | 12/2008 | Sites | 382/232 |
| RE41,152 E | | 2/2010 | Reynar et al. | 708/203 |
| 7,692,560 B2 | | 4/2010 | Garakani et al. | 341/51 |
| 8,044,829 B2 | * | 10/2011 | Chen et al. | 341/51 |
| 8,090,027 B2 | | 1/2012 | Schneider | 375/240.23 |
| 8,125,364 B2 | | 2/2012 | Torii | 341/151 |
| 8,179,291 B2 | * | 5/2012 | Shalev et al. | 341/51 |
| 8,243,340 B2 | | 8/2012 | McDowell et al. | 358/426.13 |
| 8,643,515 B2 | * | 2/2014 | Cideciyan | 341/65 |

* cited by examiner

*Primary Examiner* — Peguy Jean Pierre
(74) *Attorney, Agent, or Firm* — Chrispher P. Maiorana, PC

(57) ABSTRACT

An apparatus includes a first circuit and a second circuit. The first circuit may be configured to generate a reduced representation of an input sequence of characters by replacing a repetition of a sequence of one or more characters by a code representing the repetition of the sequence of one or more characters. The second circuit may be configured to generate a compressed representation of the input sequence of characters in response to the reduced representation of the input sequence of characters. The second circuit is generally configured to recognize the code representing the repetition of the sequence of one or more characters and take into account the repetition of the sequence of one or more characters during a compression operation.

20 Claims, 7 Drawing Sheets

OPTIMIZING COMPRESSION ENGINE THROUGHPUT VIA RUN PRE-PROCESSING

FIELD OF THE INVENTION

The present invention relates to data storage generally and, more particularly, to a method and/or apparatus for optimizing compression engine throughput via run pre-processing.

BACKGROUND OF THE INVENTION

Compression techniques such as some variations of Lempel-Ziv (LZ) reduce an input stream into a self-referencing "dictionary" where a second occurrence of a string of characters is replaced by a copy command referencing a prior occurrence of the string as a number of characters (i.e., a length) at a certain offset prior to a current position. For example, the string "bcdezbcde" could be compressed to the string "bcdez" followed by a command to copy a length of 4 characters starting at an offset 5 characters previous to the current position (i.e., "Copy(4,5)"). If the instruction "Copy (4,5)" takes fewer bits to output than the corresponding string of characters, the output is more compressed than the input.

Ideally, compression engines try to find an optimal set of copy instructions to produce a resulting output that is as short as possible. However, practical limits of time and space, particularly for hardware implementations, make achieving good compression in a short amount of time difficult.

It would be desirable to implement run pre-processing to optimize compression engine throughput.

SUMMARY OF THE INVENTION

The present invention concerns an apparatus including a first circuit and a second circuit. The first circuit may be configured to generate a reduced representation of an input sequence of characters by replacing a repetition of a sequence of one or more characters by a code representing the repetition of the sequence of one or more characters. The second circuit may be configured to generate a compressed representation of the input sequence of characters in response to the reduced representation of the input sequence of characters. The second circuit is generally configured to recognize the code representing the repetition of the sequence of one or more characters and take into account the repetition of the sequence of one or more characters during a compression operation.

The objects, features and advantages of the present invention include providing a method and/or apparatus for optimizing compression engine throughput via run pre-processing that may (i) pre-process an input character stream to squish runs prior to performing a dictionary search, (ii) pre-process an input character stream to squish any repetition of a character sequence prior to performing a dictionary search, (iii) provide LZ search/matching rules to match squished runs as well as characters, (iv) enable selecting a current run over an earlier match, and/or (v) be implemented in hardware, in firmware, or in a combination of hardware and firmware.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Compression engines generally implement some type of search technique over a block (or sequence) of data being compressed. For example, at each character position a search may be performed looking for previous matches (e.g., prior occurrences of the string at the current character position). A compression engine in accordance with an embodiment of the present invention generally operates by "squishing" an input stream to make the input stream more compact prior to the compression engine search step. Squishing the input stream prior to the search step generally gives a compression engine that is modified to understand "squished" runs more time to search for better matches, as runs may be processed in a much quicker fashion once squished. Embodiments of the present invention generally provide a relatively generic, hardware-friendly scheme.

Figure 1:
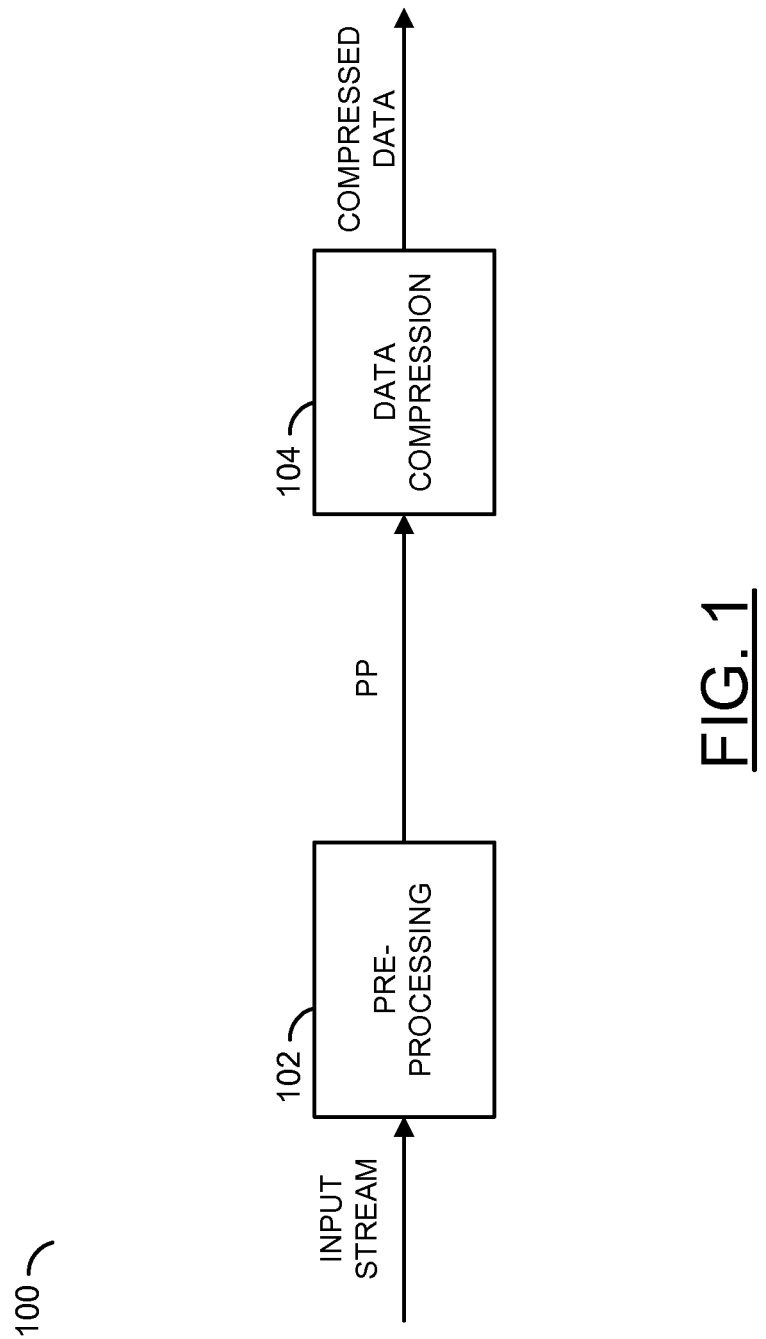
FIG. 1 is a diagram illustrating a data compression engine in accordance with an embodiment of the present invention.

Referring to FIG. 1, a diagram of a circuit 100 is shown illustrating a compression engine in accordance with an embodiment of the present invention. In one example, the circuit 100 may comprise a block (or circuit) 102 and a block (or circuit) 104. The block 102 may implement a pre-processing module in accordance with an embodiment of the present invention. The block 104 may implement a compression module in accordance with an embodiment of the present invention. The block 102 may have an input that may receive a signal (e.g., INPUT STREAM) and an output that may present a signal (e.g., PP). The signal INPUT STREAM may comprise blocks, sequences, or other data structures. The signal PP may comprise a data structure configured for presenting a pre-processed data structure. The pre-processed data structure may be a smaller (e.g., squished) version of the signal INPUT STREAM. In one example, the pre-processed data structure may comprise run length encoding of the signal INPUT STREAM. In one example, the block 102 may be configured to perform a pre-processing operation that transforms runs in the signal INPUT STREAM into a more compact form. For example, runs may be replaced by codes, commands, syntax elements, etc.

The block 104 may have an input that may receive the signal PP and an output that may present a signal (e.g., COMPRESSED DATA). The signal COMPRESSED DATA may comprise a compressed version of the signal INPUT STREAM. The block 104 may be configured to recognize the more compact form of the runs (e.g., codes, commands, syntax elements, etc. representing the runs) presented by the block 102 via the signal PP while performing a compression pass. The block 104 is generally configured to understand (interpret) the codes, commands, syntax elements, etc. representing the runs in order to take into account the runs represented by the codes, commands, syntax elements, etc. during search operations. In one example, the block 104 may perform Lempel-Ziv (e.g., LZ77) compression.

Embodiments of the present invention may provide a compression process that provides a pre-processing (e.g., squishing) pass prior to the compression pass (e.g., LZ encoding). The squishing pass transforms runs into a more compact form, reducing the size of the input stream being compressed. For example, if a typical input frame (e.g., a quantity of information being compressed as a unit) has 4096 characters and averages 100 runs with an average length of 13, the input to the compression processing pass itself may be reduced from 4096 characters to (on average) 2796 characters and some representation for the 100 squished runs. The compression pass then has only 2896 characters or representations to be searched, a ~29% savings in the amount of time the compression processing pass takes. In other words, the compression process in accordance with embodiments of the present invention may allow 29% more time in a fixed budget to be applied to better compression processing.

The runs may be any repeated character sequence. Single-character runs are generally quite common. However, in some character sets (e.g., Unicode), two-character repetitions are quite common as well. The explanation that follows uses single-character runs, and extensions for more complex repetitions (such as pairs of bytes as in Unicode) are explained thereafter. The term "run" is generally used herein to refer to a repeated sequence of a single-character. The term "repetition" is generally used herein to refer to a repeated sequence of two or more characters.

Figure 2:
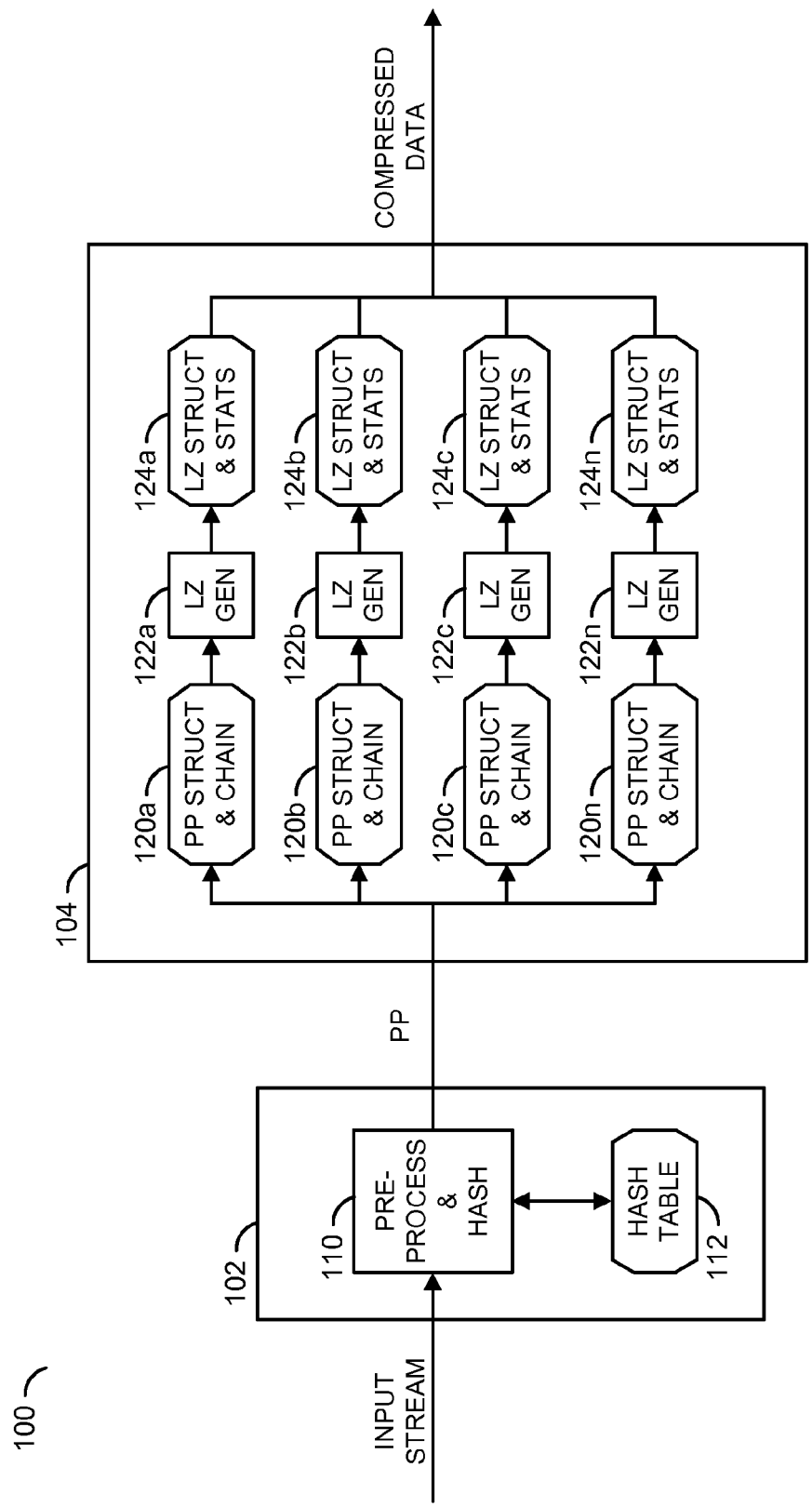
FIG. 2 is a diagram illustrating an example implementation of a pre-processing module and a compression module of FIG. 1.

Referring to FIG. 2, a diagram is shown illustrating an example implementation of a pre-processing module and a compression module of FIG. 1. In one example, an overall hardware (H/W) structure may comprise stages of processing and data structures. The data structures may be stored in buffers. The buffers may be implemented, for example, in random access memory (RAM). In one example, the block 102 may be implemented comprising a pre-processing and hash processing stage 110 and a hash table data structure 112. In one example, the block 104 may implemented as one or more instances of a compression engine. In one example, the block 104 may implement a number (e.g., n) of parallel copies of a Lempel-Ziv compression engine ("LZ Gen"). For example the block 104 may comprise a number of buffers 120a-120n (e.g., containing PP structures and chains), a number of LZ compression engines 122a-122n, and a number of buffers 124a-124n (e.g., containing LZ output data structures and statistics generated by the LZ compression engines 122a-122n). The particular number n of PP structures and chains, LZ compression engines, and LZ output data structures and statistics implemented generally depends on the desired throughput. The output of the block 104 may be further processed by a bitstream encoding pass. In one example, the bitstream encoding pass may be implemented using conventional techniques. In another example, the bitstream encoding technique described in co-pending U.S. patent application Ser. No. 13/651,627, filed Oct. 15, 2013, may be *implemented*. Further, while the *pre-processing* and hashing pass and a bitstream encoding pass may be implemented as common logic (*e.g.*, used by all the compression engines 122a-122n), in other embodiments multiple pre-processing and hashing passes and/or multiple bitstream encoding passes may be implemented relative to the compression engines, including static or dynamic assignment in any combination.

In some embodiments, the block 110 is configured to pre-process the input character stream of each input frame and process runs, producing the PP structures (which are subsequently stored in the buffers 120a-120n) with one entry per literal and three entries per run of three or more characters. The term literal refers to a character that is a copy of the corresponding character from the input stream. Similarly the term literals refers to one or more characters that are a copy of the corresponding one or more characters from the input stream. Runs of three or more characters are encoded, and include all characters possible. In parallel, a random access memory 112 holding a large hash table is used to build the hash chains for the input frame.

The output of the pre-processing module 102 is written alternately into the number of buffers 120a-120n so that each of the number of LZ engines 122a-122n has a longer period to operate on each input frame. For example, in an embodiment where n=4, four buffers 120a-120d, four LZ engines 122a-122d, and four buffers 124a-124d may be implemented, giving the LZ engines 122a-122d four times as long to operate on each input frame. The LZ engines 122a-122n each process (on average) one byte per cycle. Thus, when running, for example, at 400 MHz, each has a throughput of 400 MBps. The LZ engines 122a-122n generally produce an LZ structure containing copy commands and literals, plus statistics on different encoding methods for literals, lengths, offsets, and flags values. The terms lengths, offsets, and flags refer to numeric values used in compression techniques to replace repeated sequences of characters. The LZ structures produced by each of the LZ engines 122a-122n are generally stored in the respective data buffers 124a-124n. In order to provide a predetermined throughput, a particular LZ engine may run out of time and have to stop compressing (and output any remaining portion of the input frame uncompressed, as if no matches were found). Time may be shared among engines, though, since average (not worst-case) throughput is what matters. The LZ structure includes a copy of the raw input in case compression fails. Compression failure may not be known until after bitstream encoding (described below in connection with FIG. 6).

Compression is generally performed as one or more passes. For example, a first pass may use a hash (and a hash table) to create a chain (pointer) table indicating all occurrences of three-character or four-character strings in the input stream. The chain table generally allows matches to be found more quickly. A second pass (e.g., the compression processing pass) may use the chain table to find the best "matches" earlier in the input stream for any repeated sub-strings. The characters of repeated sub-strings may be replaced with copy instructions, creating the self-referencing dictionary. A third pass then turns the remaining characters and the copy instructions into an output bitstream. In between the second and third passes, statistics are generally used to determine how to best generate the output bitstream (generally, best means with the fewest bits). For example, the set of characters used in the input may be compressed in a number of ways. Knowledge of the distribution of lengths and offsets in the copy instructions may be used to compress those values.

In some embodiments, a "squishing" step to reduce runs of characters to a more compact representation may be added as part of the hashing step, eliminating extra passes over the data and reducing latency. Adding squishing as part of or prior to hashing also reduces the number of hashes that are performed, saving time in that part of the process. In other embodiments, squishing may be done as a separate pass either before or after hashing. In still further embodiments, squishing may be done as a first part of the compression pass and runs may be "squished" just prior to being considered by the compression engine.

Figure 3:
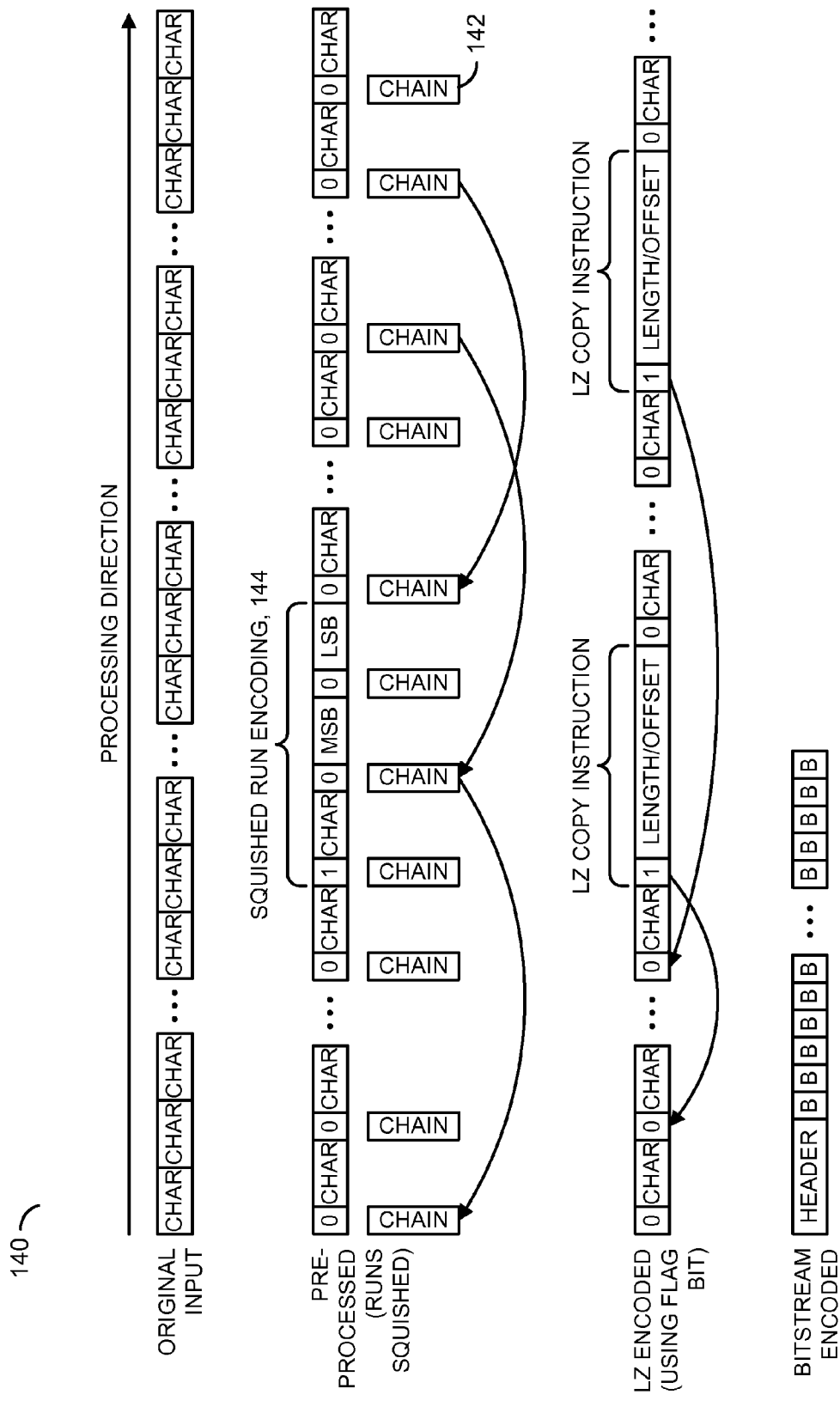
FIG. 3 is a diagram illustrating an bitstream encoding process in accordance with an embodiment of the present invention.

Referring to FIG. 3, a diagram is shown illustrating an example of an overall processing flow 140, where each entry in the squished stream is shown as having a corresponding chain pointer 142 produced by the hashing and indicating locations of previous possibly-matching sub-strings if any. Squishing results in a reduced input stream. In some embodiments, the input stream is not actually reduced, but holes are left in the input stream that may be skipped by the compression engine.

Subsequent to squishing, the runs need to be represented in the resulting stream. Representing the runs can be done in a number of ways. For example, the pre-processed version of the signal INPUT STREAM may have one bit added per symbol (e.g., either a character or a run indication) indicating whether the symbol represents a literal or is related to a run. Alternatively, since each active (non-squished) position has a corresponding chain pointer 142 (produced by the hashing step), information may be added in the chain table indicating a run at that position. However, other representations may be implemented accordingly to meet the design criteria of a particular implementation.

When runs are squished, additional information is encoded with each run. For example, an encoded run may include the length of the run, or location to or an offset to the last character in the run, or other equivalent information. In some embodiments, as illustrated in FIG. 3 runs are at least three characters (e.g., a character repeated twice is generally not treated as a run). A run is generally represented by a squished run encoding 144 comprising three characters. The squished run encoding 144, in one example, uses a flag bit (e.g., '1') to indicate that the symbol is a run, one character (e.g., CHAR) to provide the repeated character itself, and two characters (e.g., MSB, LSB) to encode the length of the run. In various embodiments, encoding the length of the run in the pre-processed stream itself enables more efficient matching of runs during the compression engine processing. In other embodiments run length may be limited to have a smaller squished encoding for runs, and a run longer than that representable may be represented as a sequence of two or more runs. Each position in the corresponding squished input stream has a corresponding chain pointer 142 created by the hashing. The chain pointer 142 points to possible earlier matching locations in the input stream. For example, with three-character hashing, the pointer for a current input stream position starting with "abc" would point to the closest prior location of a previous "abc" sequence (if any), and the pointer for that previous location would point to a further closest prior location of a previous "abc" sequence (if any), etc. Searching uses the chain pointers to enable searching only when there are possible, earlier matches. In other words, only non-NULL chain pointers need be followed. It is of particular note that without squishing of runs, each character in a run (after enough initial characters to cover the length of hashing) has a non-NULL chain pointer pointing to an earlier position in the run.

Three-character hashing is used in some embodiments since a copy instruction for a previous three-character sequence generally saves some space (whereas a copy instruction for a previous two-character sequence often does not). Other embodiments hash on other lengths, or on a combination of lengths (such as both three and four characters).

Figure 4:
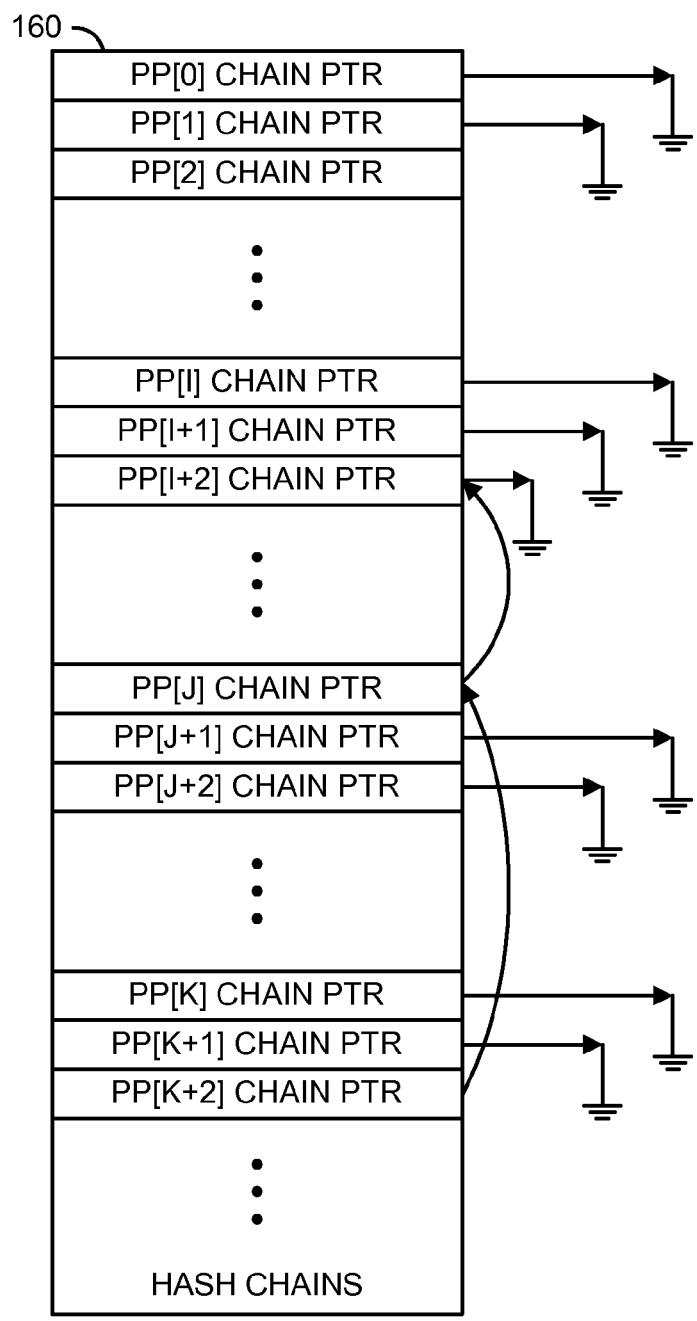
FIG. 4 is a diagram illustrating an example of a hash chain table.

Referring to FIG. 4, a diagram is shown illustrating another conceptual view of a chain table 160. Using a large (e.g., 16 KB, 32 KB, etc.) hash table, hash each successive triplet of characters in the PP structure. The hash is associated with the first character of a triplet. For example, the hash for the triplet composed of the characters at position i, i+1, and i+2 is associated with index i. A run will be hashed three times (regardless of length) as it takes up three indices in the PP structure. For example, the run "aa . . . aabc" will be hashed as "aaa", "aab", and "abc", and each of these hashes is associated with the starting index of the respective triplet. In one example, all runs may take three entries in the PP structure. As each triplet is hashed, the hash value is looked up in the hash table (e.g., the hash value is an index into the hash table). On a miss, the chain pointer for that index is set to NULL, and the index is stored at the hash location in the hash table. On a hit, the chain pointer for that index is set to the old value found in the hash table at that location (e.g, the previous index that hashed to the same value), and the index is stored at the hash location in the hash table.

In this fashion, the chain pointers become a linked list (in order from locations closer to the end towards the start) of indices that hashed to the same location in the hash table. Once the chain structure is created, the hash table is not needed for further processing of the input frame, because the chain structure has all the necessary information as to which indices hash the same as which other indices. In general, the hash chains should be stored four or eight per row so that multiple pointers may be examined in parallel. LZ processing can thus easily handle multiple null pointers per cycle (e.g., just generating the corresponding number of literal copies).

With squishing and with n-character hashing, any run greater than or equal to n characters in length will need n separate chain table entries. Consider, for example, the character sequence "abcdexxxxxfghij" with three-character hashing. No matter how the five-character run "xxxxx" is squished, there are three hashes that need to be tracked as part of this run: e.g., "xxx", "xxf", and "xfg" or "dex", "exx", and "xxx". Thus in terms of at least the chain table, a squished run cannot be represented in fewer than n character positions (with n-character hashing).

Figure 5:
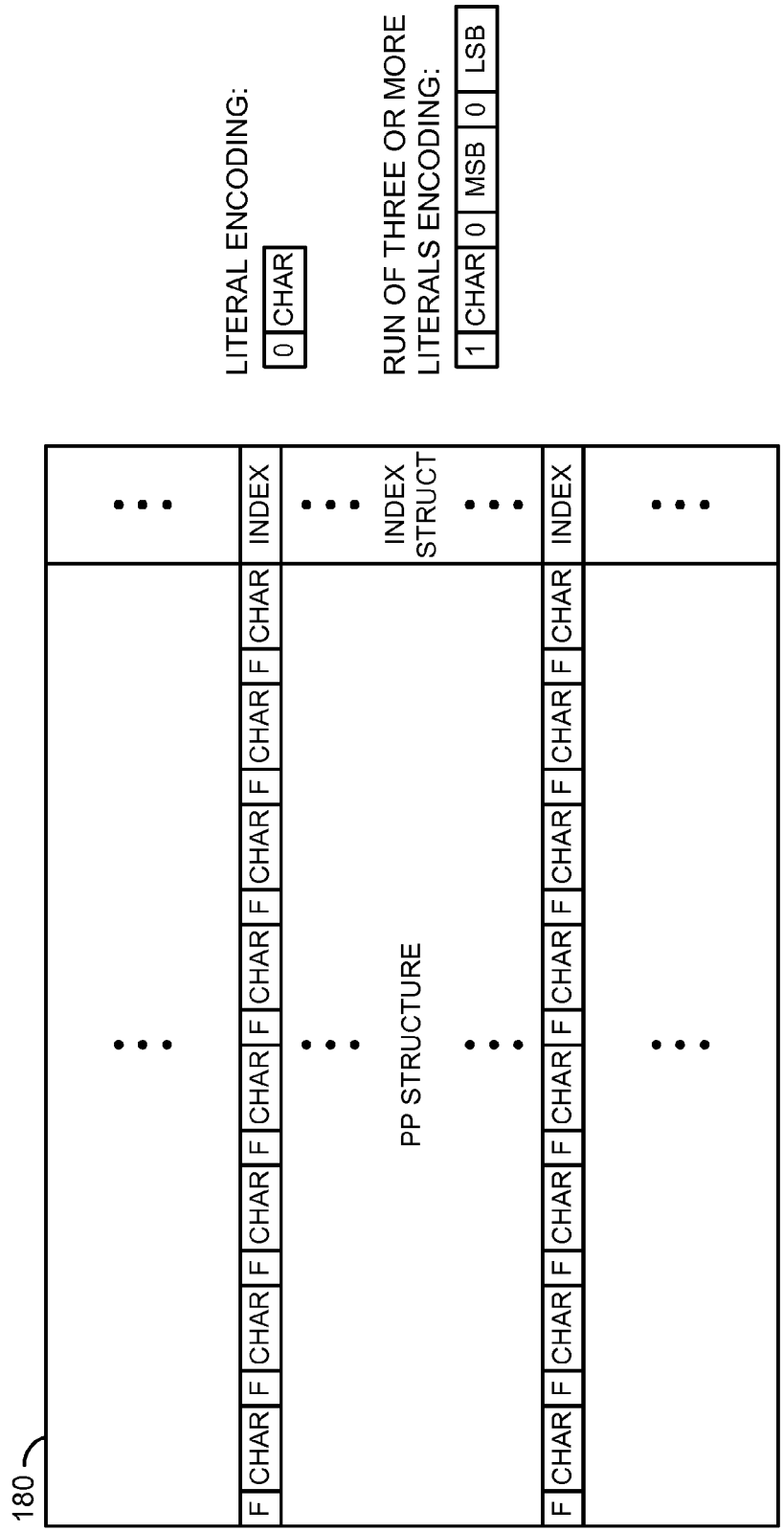
FIG. 5 is a diagram illustrating an array storing a side table in accordance with an embodiment of the present invention.

Referring to FIG. 5, a diagram is shown illustrating an example of a side table in accordance with an embodiment of the present invention. If the squished (pre-processed, or "PP") stream is reduced in size, then each position in the squished stream needs to also track, such as in a side table, the index of that position in the original stream, as this information is needed to compute the proper offsets for copy instructions. A side table 180 is shown in FIG. 5, illustrating an example approach where a group of reduced characters (e.g., eight or sixteen reduced characters) share a single "index" location in the original input stream. The index of any specific reduced character within a group of eight may be found by counting within the group, including counting the length of any runs prior to the specific reduced character, and using that as an offset to the shared index.

In the compression processing, a search is made from a current position forward to find the first, non-NULL chain pointer after the current position. The non-NULL chain pointer indicates a possible prior match. The match is only possible (not guaranteed) since the non-NULL chain pointer is not a guarantee that even the first three characters match, it is just a guarantee that the first three characters hashed the same. In general, if the initial hash was perfect, the non-NULL chain pointer could be a perfect guarantee, but that implies either a very large or a fully associative hash table was used, neither of which is particularly practical for a hardware implementation. If there was no match (or no acceptable match, such as a match longer than a specified minimum length), searching for the next non-NULL chain pointer continues starting after the current position (e.g., the character at the current position is output from the compression engine as is, and the current position is advanced by one). If a match of a given length, x, is found, x characters starting at the current position are replaced by a copy instruction (e.g., referencing the match), and the current position is advanced by x characters (e.g., to the first character after the match) where searching for the next non-NULL chain pointer continues.

When a match is indicated (e.g., by the non-NULL chain pointer), a matching phase compares characters starting at the current position with characters at the position indicated by the non-NULL chain pointer. A length of matching characters is accumulated up until a non-matching character is found. If the chain pointer at the position indicated by the non-NULL chain pointer is also non-NULL, matching can be repeated further back in the input stream to see if a longer match can be found. The longest match found, if greater than a minimum length, is chosen and the characters at the current position are replaced by a copy instruction referencing the earlier occurrence of the same string (e.g., at a determined offset in the original input from the current location, and for the matched length). The number of chain table searches that can be done is limited, in some embodiments, to bound the overall compression processing time and achieve a desired throughput.

Squishing of runs modifies the compression processing in one or more ways. Input to the compression processing comprises not just single characters, but also a representation of squished runs, and the compression processing needs to handle these two types of "symbols." The compression pass is enabled to process a squished run as a unit (one symbol), both during the search for the next non-NULL chain pointer, and during the matching phase.

Using three-character hashing, any run of three or more characters has only three unique hash possibilities, independent of the length of the run. For example, in the sequence 'abcxxxxxdef', only three hashes starting in or after the run are unique: 'xxx' in the first and any middle positions, 'xxd' in the next-to-last position, and 'xde' in the last position. ('bcx' and 'cxx' are treated as the hashes of strings starting in those positions and are not part of the run.) Thus, searching for the next non-NULL chain pointer need only look at three possible chain pointers for any run of three characters or more, regardless of the length of the run. This improves the time to find the next non-NULL chain pointer. In embodiments where the input stream is reduced to produce the squished stream, there are no "holes" and time is saved without further complexity. In embodiments where the squished stream has "holes" during portions of a run that may be skipped, extra logic is optionally used to advance over a run to more quickly find the next non-NULL chain pointer.

When creating the chain pointers for a run, the three relevant positions (e.g., 'xxx', 'xxd', and 'xde' in the above example) are handled as follows. All characters at the start or middle of a run are treated as a single position. The chain pointer for the 'xxd' position would point to the closest previous occurrence of 'xxd' which might have been at the tail part of a run, or might have been just two 'x' characters without a third (e.g., 'axxd'). The chain pointer for 'xde' may be handled similarly.

During the matching phase, a squished run is also compared as a unit, rather than as individual characters, greatly speeding up matching. During the matching phase, special rules are needed when matches start or end with squished runs. Consider first the case where a run occurs in the middle of a match (and possibly ends the match). Using the encoding described above in connection with FIG. 3 (e.g., the initial character followed by the run length replaces the run), there are two choices: 1) the run is an exact match in character value and length, and matching works as for any other string of three characters (e.g., the initial character, the MSB of the length, and the LSB of the length all match), and matching continues with the character following the run; 2) the run is not an exact match, and the run at the current position is either shorter or longer than the run at the position being matched. In the second case, the matching clearly ends (e.g., part of the comparison, such as of the LSB, fails), and the length of match is increased by the shorter of the run at the current position or the run at the matching position. The matching phase would then optionally continue with a previous non-NULL chain pointer.

This leaves the case where the current position is one of the three positions we consider as part of the run ('xxx', 'xxd', and 'xde' in the above example). There are sixteen cases to consider: whether the current position is not part of a run, or is the first, next-to-last, or last position of a run, crossed with whether the matching position (pointed to by a chain pointer from the current position, or followed from a chain pointer from the previous matching position) is not part of a run, or is the first, next-to-last, or last position of a run. The actions may be summarized in the following TABLE 1:

TABLE 1

| Current Position is/<br>Matching Position is | Not in a run | First in a run | Next-to-Last in a run | Last in a run |
| --- | --- | --- | --- | --- |
| Not in a run | normal | no match | smear | smear |
| First in a run | no match | smear* | no match | no match |
| Next-to-Last in a run | smear | no match | smear | no match |
| Last in a run | smear | no match | no match | smear |

In some embodiments, to make matching work as similarly as possible even in the presence of squished runs, a run at the current position and any run at the initial matching position (pointed to by a chain pointer) are "smeared" so that the encoded length is replaced by the first character of the run. For example, for purposes of character comparison any run will look like a three-character sequence of one repeated character. In further embodiments, the smearing is done whether the current position is the first, next-to-last, or last of a run, and similarly and separately for the initial matching position. With smearing, a sequence such as 'xxdef' at the current position would transparently match with the tail of a run such as 'xxxxxdef' starting at the next-to-last position, even though the run is encoded as a single 'x' followed by a length of 0 (MSB) and 5 (LSB), because for matching purposes the 'x' is "smeared" and the encoded length ignored in these initial-run cases. In general, the first position of a run can only match the first position of another run, because by definition all runs are encoded and are at least three characters.

The smearing handles matching, and length computation works as normal in the non-first-position cases. In the first-position (two runs) case ("smear*" in TABLE 1 above), the following additions are needed:

The initial match length is the shorter of the two runs.

The offset of the match is the initial match length back from the end of the matching run (e.g., the two runs being justified at their ending, rather than starting, positions). This produces the shortest offset, which improves compression. (Offsets are computed using the position the character had in the input stream.)

The matching ends (for this matching position) if the run at the current position is longer. If the run at the current position is shorter, then matching can continue, assuming the two runs are justified at their ending positions. (E.g., the current position starts with 'xxxde' and the matching position starts with 'xxxxxxxxxde'—the runs match with a length of 3 and matching can continue after the runs).

In some embodiments, matching with runs may be optimized using other techniques. For example, if the reduced stream has not removed the positions in the middle of the run, matching may proceed as in an unmodified compression engine. Or, in other embodiments, matching may use information on the run length to quickly determine if the match ends (e.g., run lengths differ), or if not that the match should continue after skipping over the run.

When completing the matching phase where the current position is the first position of a run, it is possible that all prior matching runs were shorter than the current run, or that an offset to the best prior matching run is too long. In this case, the best compression result is obtained by outputting the run itself in a self-referencing fashion: one copy of the repeated character, followed by a copy instruction with an offset referencing the copy of the repeated character and a length equal to one less than the total length of the run. In some embodiments, runs are converted to copy instructions as part of the compression pass. In other embodiments, the compression pass leaves any unmatched encoded runs in the output of the compression pass, and bitstream encoding converts any leftover runs into self-referencing copy instructions.

Extensions to multi-character runs are also contemplated. Consider two-character runs, for example "ababab" or "ababba". One difference is that the repetition can end in either one of the two characters. In some embodiments, two-character repetitions are always stored in a canonical order (such as the smaller one of the two character first), along with the length of the repetition in total characters and two extra bits encoding whether the starting character of the repetition is the smallest (first-encoded) character or the larger (second-encoded) character. For example, both "babab" and "ababab" would be stored as "ab" followed by encoding for the length and the two extra bits. One advantage of storing in canonical order is that both a "baba . . . " repetition and a "abab . . . " repetition have a chain pointer in the first position corresponding to "aba". For three-character hashing, chain pointers for the next to-last and last positions will be different for each occurrence regardless of starting order due to differences in the characters after the repetition. For initial repetitions, the matching logic needs to adjust the offset and/or the length based on how the current and matching positions end. Similar adjustments need to be made if a match ends at a repetition (and whether the two repetitions start with the same character or not).

Figure 6:
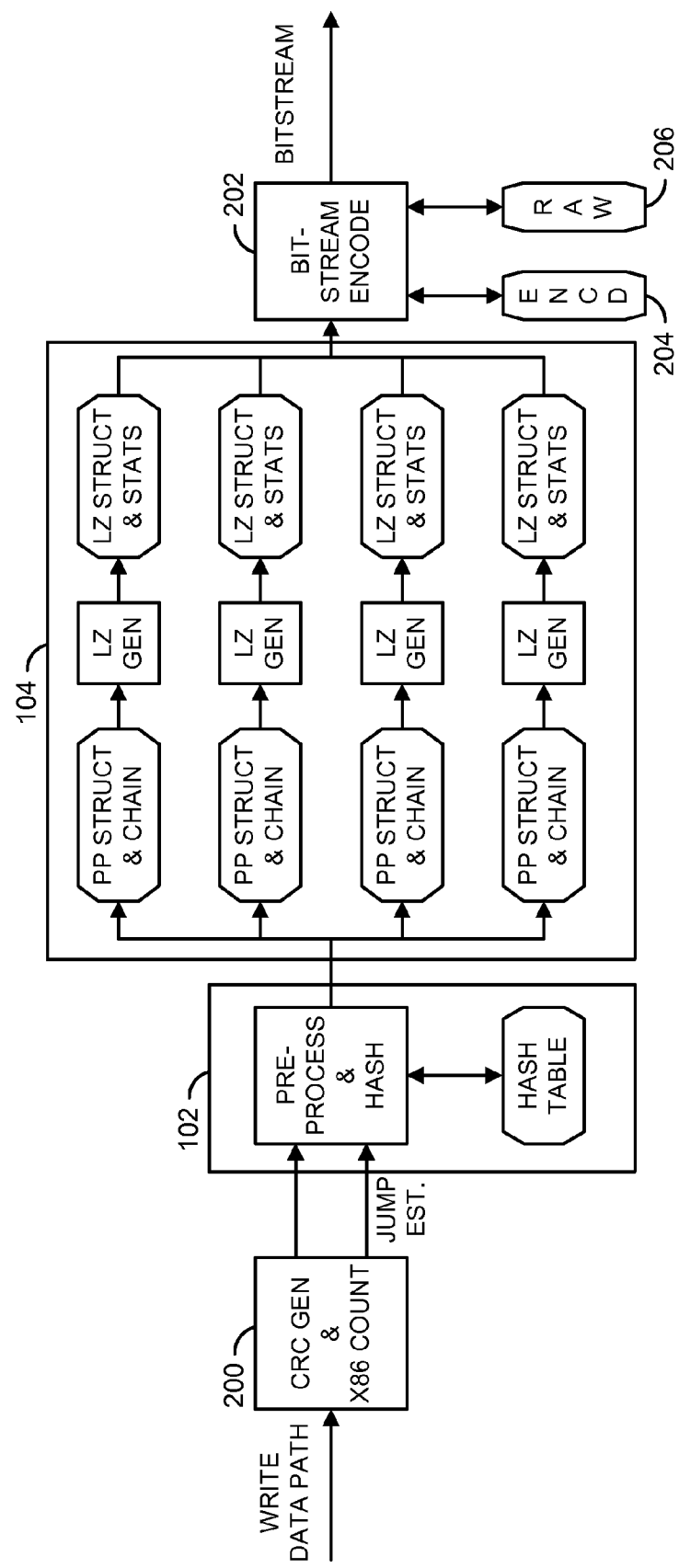
FIG. 6 is a diagram illustrating a compression engine in accordance with an embodiment of the present invention including CRC generation and jump handling and bitstream generation.

Referring to FIG. 6, a diagram is shown illustrating a compression engine in accordance with an embodiment of the present invention implemented in a system including CRC generation and jump handling and bitstream generation. Prior to the pre-processing operation described above, input data may be processed by a CRC generation and jump counting module 200. CRC generation is performed over each host page (appending the CRC bytes at the end). For the first ~256 bytes of each input frame, a count of x86 jump instructions is performed to estimate if x86 jump filtering should be performed. This is a short store-and-forward since this info is needed at the start of pre-processing. The output of the compression engine may be presented to a bitstream encoder module 202. The bitstream encoding module 202 uses the LZ generated statistics to determine the best encoding format, and then processes the LZ structure to produce an encoded form. The encoded output may be stored in a buffer 204 and the original (or raw) input may be stored in a buffer 206. In some embodiments, bitstream encoding operates store-and-forward using ping-pong buffering because a determination needs to be made whether the encoded output is good enough, or if the original input should be used instead.

Figure 7:
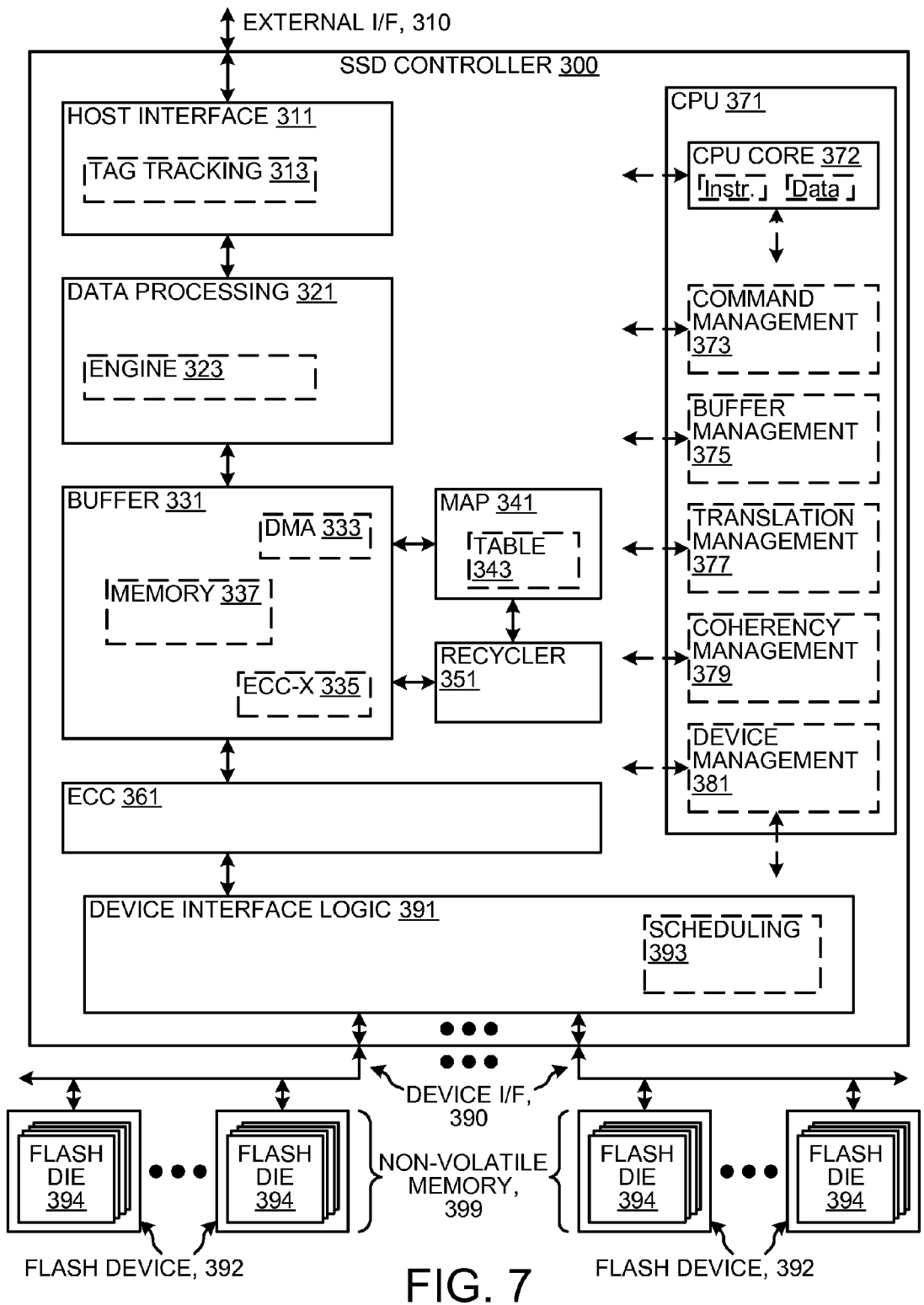
FIG. 7 is a diagram illustrating a solid-state disk (SSD) including an SSD controller in which bitstream encoding techniques in accordance with an embodiment of the present invention may be implemented to compress data prior to storage into non-volatile (e.g., Flash) memory.

Referring to FIG. 7, a diagram is shown illustrating a solid-state disk (SSD) including an SSD controller 300 in which bitstream encoding techniques in accordance with an embodiment of the present invention may be implemented to compress data prior to storage into non-volatile (e.g., Flash) memory. The SSD controller 300 may be coupled via one or more external interfaces 310 to a host (not shown). According to various embodiments, external interfaces 310 are one or more of: a SATA interface; a SAS interface; a PCIe interface; a Fibre Channel interface; an Ethernet Interface (such as 10 Gigabit Ethernet); a non-standard version of any of the preceding interfaces; a custom interface; or any other type of interface used to interconnect storage and/or communications and/or computing devices. For example, in some embodiments, the SSD controller 300 includes a SATA interface and a PCIe interface.

The SSD controller 300 is further coupled via one or more device interfaces 390 to non-volatile memory 399 including one or more storage devices, such as flash devices 392. According to various embodiments, device interfaces 390 are one or more of: an asynchronous interface; a synchronous interface; a DDR synchronous interface; an ONFI compatible interface, such as an ONFI 2.2 compatible interface; a Toggle-mode compatible flash interface; a non-standard version of any of the preceding interfaces; a custom interface; or any other type of interface used to connect to storage devices.

The Flash devices 392 have, in some embodiments, one or more individual flash die 394. According to a type of a particular one of the flash devices 392, a plurality of flash die 394 in the particular flash device 392 are optionally and/or selectively accessible in parallel. The Flash devices 392 are generally representative of one type of storage device enabled to communicatively couple to SSD controller 300. However, in various embodiments, any type of storage device is usable, such as an SLC NAND flash memory, MLC NAND flash memory, NOR flash memory, read-only memory, static random access memory, dynamic random access memory, ferromagnetic memory, phase-change memory, racetrack memory, or any other type of memory device or storage medium.

According to various embodiments, the device interfaces 390 are organized as: one or more busses with one or more flash devices 392 per bus; one or more groups of busses with one or more flash devices 392 per bus, where busses in a group are generally accessed in parallel; or any other organization of flash devices 392 coupled to device interfaces 390.

The SSD controller 300 may have one or more modules, such as a host interface module 311, a data processing module 321, a buffer 331, a map 341, a recycler 351, an error-correcting code (ECC) module 361, a central processing unit (CPU) 371, and device interface logic 391. The specific modules and interconnections illustrated in FIG. 10 are merely representative of one embodiment, and many arrangements and interconnections of some or all of the modules, as well as additional modules not illustrated, may be implemented to meet the design criteria of a particular implementation. In a first example, in some embodiments, there are two or more host interfaces 311 to provide dual-porting. In a second example, in some embodiments, the data processing module 321 and/or the ECC module 361 are combined with the buffer 331. In a third example, in some embodiments, the host interfaces 311 are directly coupled to the buffer 331, and the data processing module 321 optionally and/or selectively operates on data stored in the buffer 331. In a fourth example, in some embodiments, the device interface logic 391 is directly coupled to the buffer 331, and the ECC module 361 optionally and/or selectively operates on data stored in the buffer 331.

The host interface 311 sends and receives commands and/or data via the external interface 310, and, in some embodiments, tracks progress of individual commands via the tag tracking module 313. For example, the commands include a read command specifying an address (such as a logical block address, or LBA) and an amount of data (such as a number of LBA quanta, e.g. sectors) to read; in response the SSD provides read status and/or read data. For another example, the commands include a write command specifying an address (such as an LBA) and an amount of data (such as a number of LBA quanta, e.g. sectors) to write; in response the SSD provides write status and/or requests write data and optionally subsequently provides write status. In some embodiments, the host interface 311 is compatible with a SATA protocol and, using NCQ commands, is enabled to have up to 32 pending commands, each with a unique tag represented as a number from 0 to 31. In some embodiments, the tag tracking module 313 is enabled to associate an external tag for a command received via the external interface 310 with an internal tag used to track the command during processing by SSD controller 300.

According to various embodiments, one or more of: data processing module 321 optionally and/or selectively processes some or all data sent between the buffer 331 and the external interfaces 310; and data processing module 321 optionally and/or selectively processes data stored in the buffer 331. In some embodiments, the data processing module 321 uses one or more engines 323 to perform one or more of: encrypting; decrypting; compressing; decompressing; formatting; reformatting; transcoding; and any other data processing and/or manipulation task. For example, according to various embodiments, the data processing module 321 includes a compression unit (e.g., the circuit 100 described above in connection with FIGS. 1 and 2) implementing an encoding scheme in accordance with various embodiments of the present invention.

The buffer 331 stores data sent to/from the external interfaces 310 from/to the device interfaces 390. In some embodiments, the buffer 331 additionally stores system data, such as some or all map tables, used by the SSD controller 300 to manage the flash devices 392. In various embodiments, the buffer 331 has one or more of: a memory 337 used for temporary storage of data; a direct memory access (DMA) modules 333 used to control movement of data to and/or from the buffer 331; an ECC-X module 335 used to provide a higher-level error correction function; and other data movement and/or manipulation functions. An example of a higher-level error correction function is a RAID-like capability, where redundancy is at a flash device (e.g. multiple ones of the flash devices 392) level and/or a flash die (e.g. flash die 394) level instead of at a disk level.

According to various embodiments, one or more of: the ECC module 361 optionally and/or selectively processes some or all data sent between the buffer 331 and the device interfaces 390; and the ECC module 361 optionally and/or selectively processes data stored in the buffer 331. In some embodiments, the ECC module 361 implements one or more of: a CRC code; a Hamming code; an RS code; a BCH code; an LDPC code; a Viterbi code; a trellis code; a hard-decision code; a soft-decision code; an erasure-based code; any error detecting and/or correcting code; and any combination of the preceding.

The device interface logic 391 controls the flash devices 392 via the device interfaces 390. The device interface logic 391 is enabled to send data to/from the flash devices 392 according to a protocol of the flash devices 392. The device interface logic 391 includes a scheduling module 393 to selectively sequence control of the flash devices 392 via the device interfaces 390. For example, in some embodiments, the scheduling module 393 is enabled to queue operations to the flash devices 392, and to selectively send the operations to individual ones of the flash devices 392 (or the flash die 394) as individual flash devices 392 (or flash die 394) are available.

The map 341 converts between data addressing used on the external interfaces 310 and data addressing used on the device interfaces 390, using table 343 to map external data addresses to locations in the non-volatile memory 399. For example, in some embodiments, the map 341 converts logical block addresses (LBAs) used on the external interfaces 310 to block and/or page addresses targeting one or more flash die 394, via mapping provided by table 343. In some embodiments, a granularity of map 341 is fixed, such as mapping first fixed-sized logical blocks used on the external interfaces 310 to second fixed-sized blocks used on the device interfaces 390. In other embodiments, a granularity of map 341 is variable and not all blocks used on either the external interfaces 310 or the device interfaces 390 are necessarily a same size.

In some embodiments, table 343 associates logical page addresses with a respective map entry, where the logical page addresses are a portion of and/or are derived from the LBA, and the map entry identifies a portion of the non-volatile memory. For example, in some embodiments, the logical page address is a higher-order portion of the LBA, and a lower-order portion of the LBA is an offset within a logical page specified by the logical page address.

In some embodiments, the map entry identifies the portion of the non-volatile memory as a base address, such as a read unit address, and a length, such as a number of read units. In some embodiments, the read units are sequential in locations in an address space of the non-volatile memory. In further embodiments, the read units are striped across a plurality of flash die (such as flash die 394) and/or flash devices (such as flash devices 392).

In some embodiments, map 341 uses table 343 to perform and/or to look up translations between addresses used on the external interfaces 310 and data addressing used on the device interfaces 390. According to various embodiments, table 343 is one or more of: a one-level map; a two-level map; a multi-level map; a map cache; a compressed map; any type of mapping from one address space to another; and any combination of the foregoing. According to various embodiments, table 343 includes one or more of: static random access memory (SRAM); dynamic random access memory (DRAM); non-volatile memory (such as flash memory); cache memory; on-chip memory; off-chip memory; and any combination of the foregoing.

In some embodiments, the recycler module 351 performs garbage collection. For example, in some embodiments, flash devices 392 contain blocks that must be erased before the blocks are re-writeable. The recycler module 351 is enabled to determine which portions of the flash devices 392 are actively in use, such as by scanning a map maintained by map 341, and to make unused portions of flash devices 392 available for writing by erasing them. In further embodiments, the recycler module 351 is enabled to move data stored within the flash devices 392 to make larger contiguous portions of the flash devices 392 available for writing.

The CPU 371 controls various portions of SSD controller 300. The CPU 371 includes a CPU core 372. The CPU core 372 is, according to various embodiments, one or more single-core or multi-core processors. The individual processor cores in the CPU core 372 are, in some embodiments, multi-threaded. The CPU core 372 includes instruction and/or data caches and/or memories. For example, the instruction memory contains instructions to enable the CPU core 372 to execute software (sometimes called firmware) to control the SSD controller 300. In some embodiments, some or all of the firmware executed by the CPU core 372 is stored on the flash devices 392.

In various embodiments, the CPU 371 further includes: a command management module 373 to track and control commands received via the external interfaces 310 while the commands are in progress; a buffer management module 375 to control allocation and use of the buffer 331; a translation management module 377 to control the map 341; a coherency management module 379 to control consistency of data addressing and to avoid conflicts such as between external data accesses and recycle data accesses; a device management module 381 to control device interface logic 391; and optionally other management units. None, any, or all of the management functions performed by the CPU 371 are, according to various embodiments, controlled and/or managed by hardware, by software (such as software executing on the CPU core 372 or on a host connected via the external interfaces 310), or any combination thereof.

In some embodiments, the CPU 371 is enabled to perform other management tasks, such as one or more of gathering and/or reporting performance statistics; implementing SMART; controlling power sequencing, controlling and/or monitoring and/or adjusting power consumption; responding to power failures; controlling and/or monitoring and/or adjusting clock rates; and other management tasks.

Various embodiments include a computing-host flash memory controller that is similar to the SSD controller 300 and is compatible with operation with various computing hosts, such as via adaptation of the host interface 311 and/or the external interface 310. The various computing hosts include one or any combination of a computer, a workstation computer, a server computer, a storage server, a PC, a laptop computer, a notebook computer, a netbook computer, a PDA, a media player, a media recorder, a digital camera, a cellular handset, a cordless telephone handset, and an electronic game.

In various embodiments, all or any portion of an SSD controller 300 (or a computing-host flash memory controller) are implemented on a single integrated circuit (IC), a single die of a multi-die IC, a plurality of dice of a multi-die IC, or a plurality of ICs. For example, the buffer 331 is implemented on a same die as other elements of the SSD controller 300. For another example, the buffer 331 is implemented on a different die than other elements of SSD controller 300.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

The functions represented by the diagrams of FIGS. 1-7 may, in some embodiments, be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors of the machine implementation.

Embodiments of the present invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The present invention thus may also include a computer product which may be a storage medium or media and/or a transmission medium or media including instructions which may be used to program a machine to perform one or more processes or methods in accordance with the present invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

While the invention has been particularly shown and described with reference to the preferred embodiments thereof, it will be understood by those skilled in the art that various changes in form and details may be made without departing from the scope of the invention.

The invention claimed is:

1. An apparatus comprising:
    a first circuit configured to generate a reduced representation of an input sequence of characters by replacing a portion of the input sequence of characters containing a repetition of a sequence of one or more characters by a code representing the repetition of the sequence of one or more characters; and
    a second circuit configured to generate a compressed representation of the input sequence of characters using the reduced representation wherein the second circuit (i) interprets the code replacing the portion of the input sequence of characters containing the repetition of the sequence of one or more characters as representing the portion of the input sequence of characters containing the repetition of the sequence of one or more characters, (ii) takes into account all or part of the portion of the input sequence of characters containing the repetition of the sequence of one or more characters represented by the code during search operations, and (iii) does not include the code from the reduced representation in the compressed representation of the input sequence of characters.

2. The apparatus according to claim 1, wherein the first circuit is configured to replace the repetition of the sequence of one or more characters by an encoding comprising one occurrence of the sequence of one or more characters and a corresponding length according to a number of the repetition.

3. The apparatus according to claim 2, wherein the second circuit is configured to perform a modified Lempel-Ziv (LZ) compression that processes each instance of the encoding in an amount of time that is independent of the corresponding length.

4. The apparatus according to claim 3, wherein the compressed representation of the input sequence of characters is compatible with an unmodified LZ decompression.

5. The apparatus according to claim 1, wherein the repetition of the sequence of one or more characters is a repetition of a single character and the number of the repetition is at least three.

6. The apparatus according to claim 1, wherein the repetition of the sequence of one or more characters is a repetition of a pair of characters and the number of the repetition is at least two.

7. The apparatus according to claim 1, wherein the first circuit is configured to perform a run length encoding.

8. The apparatus according to claim 1, wherein the second circuit is configured to perform a modified Lempel-Ziv (LZ) compression.

9. The apparatus according to claim 1, wherein the second circuit is configured to perform a modified LZ77 compression.

10. The apparatus according to claim 1, wherein the compressed representation of the input sequence of characters comprises literals and copy instructions generated by the second circuit, and at least one of the copy instructions references a number of characters less than all of one of the repetitions.

11. The apparatus according to claim 1, wherein the first circuit and the second circuit are part of a compression unit of a solid state disk (SSD).

12. The apparatus according to claim 1, wherein the second circuit comprises one or more compression engines.

13. The apparatus according to claim 1, wherein the second circuit comprises a plurality of compression engines arranged in parallel.

14. The apparatus according to claim 1, wherein the second circuit is further configured to generate a compressed bitstream that is a loss-less representation of the input sequence of characters.

15. The apparatus according to claim 1, wherein the first circuit is configured to reduce the input sequence of characters by replacing each repetition of a sequence of one or more characters by a hole and the second circuit is further configured to skip the hole during the search operations.

16. The apparatus according to claim 1, wherein:
    the first circuit is further configured to generate a chain table indicating all occurrences of n-character strings in the input sequence, where n is a predetermined integer value; and
    the second circuit uses the chain table during the search operations.

17. A method of optimizing compression engine throughput comprising:
    generating a reduced representation of an input sequence of characters by replacing a portion of the input sequence of characters containing a repetition of a sequence of one or more characters by a code representing the repetition of the sequence of one or more characters; and
    generating a compressed representation of the input sequence of characters using the reduced representation, wherein (i) the code replacing the portion of the input sequence of characters containing the repetition of the sequence of one or more characters is interpreted as representing the portion of the input sequence of characters containing the repetition of the sequence of one or more characters, (ii) all or part of the portion of the input sequence of characters containing the repetition of the sequence of one or more characters represented by the code is taken into account during search operations, and the code from the reduced representation is not included in the compressed representation of the input sequence of characters.

18. The apparatus according to claim 1, wherein the first circuit is configured to reduce the input sequence of characters by replacing each repetition of a sequence of one or more characters by (i) a flag bit indicating a run of repeated characters, (ii) one character providing the repeated character itself, and two characters encoding a length of the run.

19. An apparatus comprising:
    a first circuit configured to generate a reduced representation of an input sequence of characters by replacing a portion of the input sequence of characters containing a repetition of a sequence of one or more characters by a code representing the repetition of the sequence of one or more characters; and
    a second circuit configured to generate a compressed representation of the input sequence of characters in response to the reduced representation of the input sequence of characters, wherein
    (i) the second circuit is configured to recognize the code replacing the repetition of the sequence of one or more characters as representing the portion of the input sequence of characters containing the repetition of the sequence of one or more characters and take into account all or part of the portion of the input sequence of characters containing the repetition of the sequence of one or more characters during a compression operation, and (ii) the compressed representation of the input sequence of characters comprises literals and copy instructions generated by the second circuit, and at least one of the copy instructions references a number of characters less than all of one of the repetitions.

20. The apparatus according to claim 19, wherein the second circuit is further configured to generate a compressed bitstream that is a loss-less representation of the input sequence of characters.

* * * * *